United States Patent
Wu

(10) Patent No.: US 7,617,769 B2
(45) Date of Patent: Nov. 17, 2009

(54) SYSTEM, METHOD, AND APPARATUS FOR MEMBRANE, PAD, AND STAMPER ARCHITECTURE FOR UNIFORM BASE LAYER AND NANOIMPRINTING PRESSURE

(75) Inventor: Tsai-Wei Wu, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 12/258,767

(22) Filed: Oct. 27, 2008

(65) Prior Publication Data

US 2009/0045534 A1    Feb. 19, 2009

Related U.S. Application Data

(62) Division of application No. 11/331,367, filed on Jan. 12, 2006, now Pat. No. 7,500,431.

(51) Int. Cl.
*B31F 1/07* (2006.01)

(52) U.S. Cl. .......................................... 101/32; 977/887

(58) Field of Classification Search ........................ None
See application file for complete search history.

(56) References Cited

U.S. PATENT DOCUMENTS

| 5,213,600 | A | 5/1993 | Greschner et al. |
| 5,669,303 | A | 9/1997 | Maracas et al. |
| 5,804,017 | A | 9/1998 | Hector |
| 6,696,220 | B2 | 2/2004 | Bailey et al. |
| 7,229,273 | B2 | 6/2007 | Bailey et al. |
| 2003/0159608 | A1 | 8/2003 | Heidari |
| 2005/0087911 | A1 | 4/2005 | Ford |
| 2007/0062396 | A1 | 3/2007 | Takai et al. |
| 2007/0134362 | A1 | 6/2007 | Heidari |
| 2007/0158866 | A1 | 7/2007 | Wu |
| 2008/0000375 | A1 | 1/2008 | Nielsen et al. |

FOREIGN PATENT DOCUMENTS

| JP | 8007346 | 1/1996 |
| JP | 8106655 | 4/1996 |
| JP | 2002100038 | 4/2002 |
| JP | 2002269853 | 9/2002 |
| JP | 2002304779 | 10/2002 |
| JP | 2004330680 | 11/2004 |
| JP | 2004335011 | 11/2004 |
| WO | WO 2004/100142 A1 | 11/2004 |
| WO | WO 2004/100143 A1 | 11/2004 |

*Primary Examiner*—David E Graybill

(57) ABSTRACT

A nanoimprinting system incorporates a patterned media contact architecture to provide a uniform imprinting pressure across the target imprinting area on a disk substrate. The system leverages the unique disk substrate characteristic of an inner diameter hole by incorporating a membrane suspension, gel-pad buffering, and air cushion loading that exploits the inner diameter hole characteristics of the disk substrate. This design dramatically increases the uniformity of the pressing pressure across the target imprinting area. As a result, a simple and effective improvement of the quality of the patterns imprinted on the recording disk substrate is realized.

3 Claims, 6 Drawing Sheets

SYSTEM, METHOD, AND APPARATUS FOR MEMBRANE, PAD, AND STAMPER ARCHITECTURE FOR UNIFORM BASE LAYER AND NANOIMPRINTING PRESSURE

This Divisional Application claims priority to U.S. patent application Ser. No. 11/331,367, filed on Jan. 12, 2006, entitled System, Method, and Apparatus for Membrane, Pad, and Stamper Architecture for Uniform Base Layer and Nanoimprinting Pressure, and is incorporated herein by reference.

BACKGROUND OF THE INVENTION

1. Technical Field

The present invention relates in general to nanoimprinting and, in particular, to an improved system, method, and apparatus for configuring a membrane, pad, and stamper architecture to achieve a uniform base layer and uniform nanoimprinting pressure.

2. Description of the Related Art

Nanoimprinting technology has developed into a high profile technology that provides a pathway to the next generation of lithography. The features of nanoimprinting, such as pillars, pits, and tracks, are on the order of about 10 nm in diameter and/or width. The capability of transferring these nano-scaled features from a template, mold, or stamper to a substrate has been vigorously demonstrated, A master is typically used to generate the templates, and the templates are then used for mass imprinting production to avoid damage to the valuable master in any imprinting accident. Moreover, the potentials for nanoimprinting in high throughput and low manufacturing cost could trigger a paradigm shift in today's optical lithography technology.

It is important for nanoimprinters to be able to achieve a reasonably uniform pressure along the contact interface so that the pattern built on the template can be uniformly imprinted onto substrates. In other words, an intimate contact simply due to high pressure may be enough to generate a uniform pattern transfer and possibly keep good fidelity of the imprinted features. However, a uniform pressure contact is required to generate not only uniform pattern transfer, but also uniform base layer thickness distribution across the imprinting zone. For example, FIG. 1 schematically illustrates a typical imprinting configuration that includes a mold/stamper/template 11 having a feature pattern 13 that forms imprinted features 15 in a resist layer 17 with a base layer 18 on a substrate 19.

The base layer thickness and uniformity is the parameter that nanoimprinting technology tries to control and perfect. Because the imprinted resist layer is acting as a etch mask for the follow-up reactive ion etch (RIE) step in the nanoimprinting process, the quality of the base layer uniformity is directly linked to the quality of the etched result.

FIG. 2 depicts the differences in the uniformity of the base layer thickness even with the same fidelity of the imprinted pattern features. The top imprint 21 is sufficient for some applications (i.e., no further processing is required), such as in the compact disc (CD) or DVD stamping business, where good fidelity of the imprinted features is the only requirement and base layer uniformity is unnecessary. See, for example, Japanese Patent JP2004330680.

However, in nanoimprinting lithography, the uniformity of the base layer becomes critical and the uniformity of bottom imprint 23 is necessary. However, the bottom imprint 23 is only possible with further processing by etching through the imprint to directly transport the pattern to the substrate. Various types of nanoimprinting tooling have been developed and commercialized. Unfortunately, in order to achieve uniform imprinting pressure, either very complicated gimbaling fixtures or much higher imprinting pressure is typically employed.

Yet another problem is encountered at the edges of the disk substrate (i.e., "edge effects") due to stress variation along the disk radial direction. As shown in FIG. 3, a conventional imprinting contact configuration comprises a substrate vacuum chuck 41 to which is mounted substrate 19. The stamper 11 is supported by a gel pad 43 and Mylar membrane 45 which extends across an opening in a fixture 47. Air pressure is applied to the membrane 45 to press the stamper 11 against substrate 19. As shown in FIG. 4, this design produces an approximately 50% variation in contact pressure in the radial direction across the imprinted zone with the gel pad (plot 51) or without the gel pad (plot 53). Although these solutions are workable, an improved solution would be desirable.

SUMMARY OF THE INVENTION

One embodiment of a system, method, and apparatus for nanoimprinting facilitates its own patterned media contact architecture to provide a uniform imprinting pressure across the entire imprinting area. The present invention employs a significantly simpler but efficient fixture solution compared to prior art designs. As opposed to typical wafer layouts, the present invention leverages the unique disk substrate characteristic of an inner diameter (ID) hole. This solution incorporates a membrane suspension, gel-pad buffering, and air cushion loading while exploiting the ID hole characteristics of the disk substrate to dramatically increase the uniformity of the pressing pressure across the target imprinting area. As a result, a simple and effective improvement of the quality of the patterns imprinted on the recording disk substrate is realized.

For example, the present invention may comprise an imprinting apparatus comprising a membrane stop ring having an opening; a membrane mounted to the membrane stop ring such that the membrane extends and seals across the opening in the membrane stop ring; a gel pad mounted to the membrane, the gel pad having a disk-like shape including an axial hole; a stamper mounted to the gel pad and having a disk-like shape including an axial hole, and a contact surface with imprint features; and a central block mounted to the membrane and extending through the axial holes of the gel pad and the stamper.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 5:
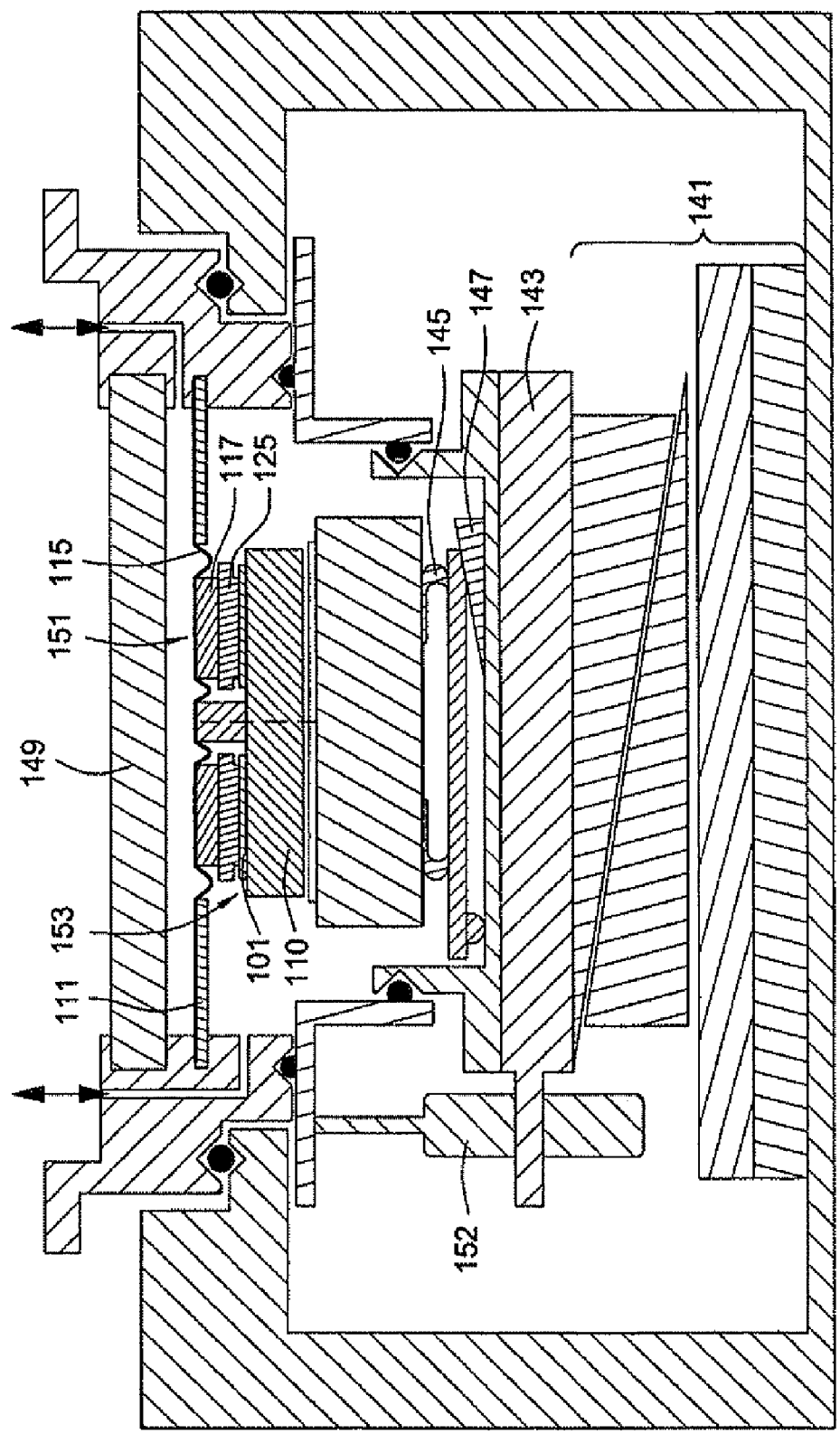
FIG. 5 is a schematic sectional view of an imprinting system constructed in accordance with the present invention.
Figure 6:
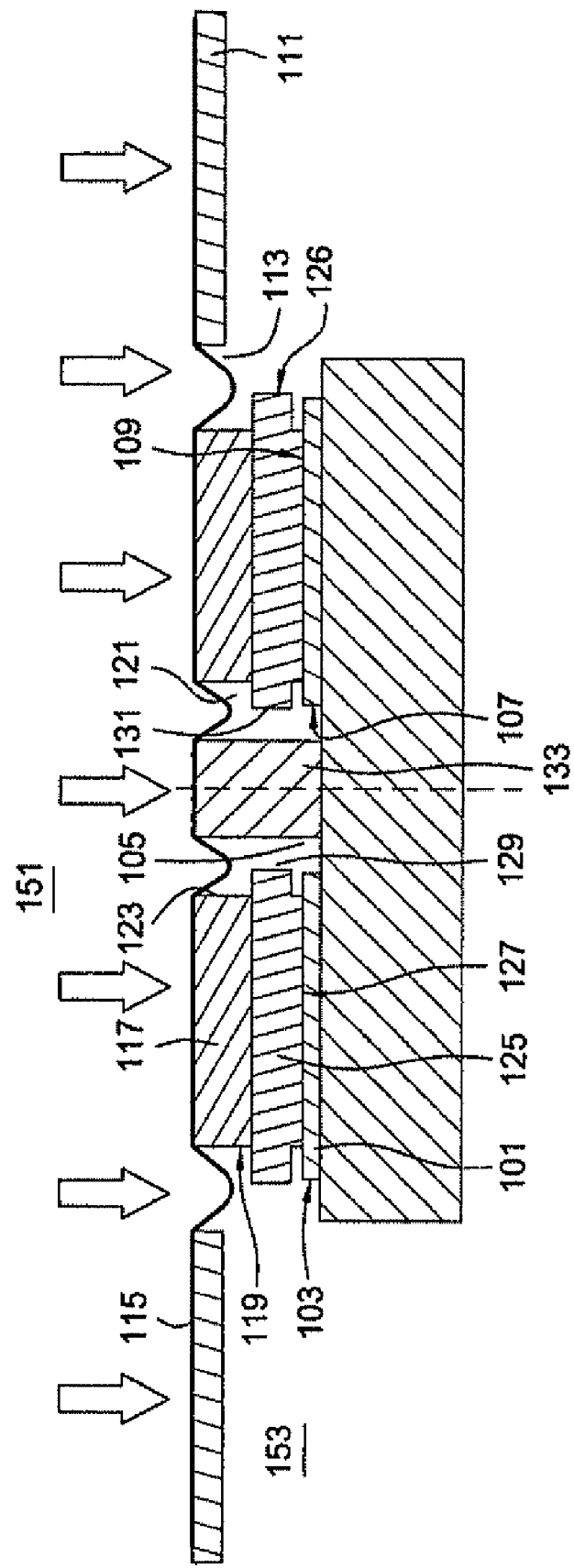
FIG. 6 is a sectional view of an imprinting contact architecture constructed in accordance with the present invention.

Referring to FIGS. 5 and 6, one embodiment of a nanoimprinting system for achieving uniform imprint pressure on a disk substrate is disclosed. The present invention comprises a disk substrate 101 having an outer diameter 103, an axial hole 105 that defines an inner diameter 107, and an imprint surface 109 extending in a radial direction. A chuck 110, such as a vacuum chuck, is used to support the disk substrate 101 opposite the imprint surface 109.

The system further comprises a membrane stop ring 111 having an opening 113. A suspension mechanism or membrane 115, such as a Mylar membrane (e.g., approximately 30 µm thick), is mounted to the membrane stop ring 111 such that the membrane 115 extends and seals across the opening 113 in the membrane stop ring 111. A gel pad 117 is mounted to the membrane 115. The gel pad 117, which has a thickness of approximately 1 to 2 mm, is employed as a stress buffer and also an interlayer to hold a stamper 125. The gel pad 117 has an outer diameter 119 and an axial hole 121 that defines an inner diameter 123 such that the gel pad 117 is disk-like or cylindrical in shape and substantially congruent with the disk substrate 101.

Figure 1:
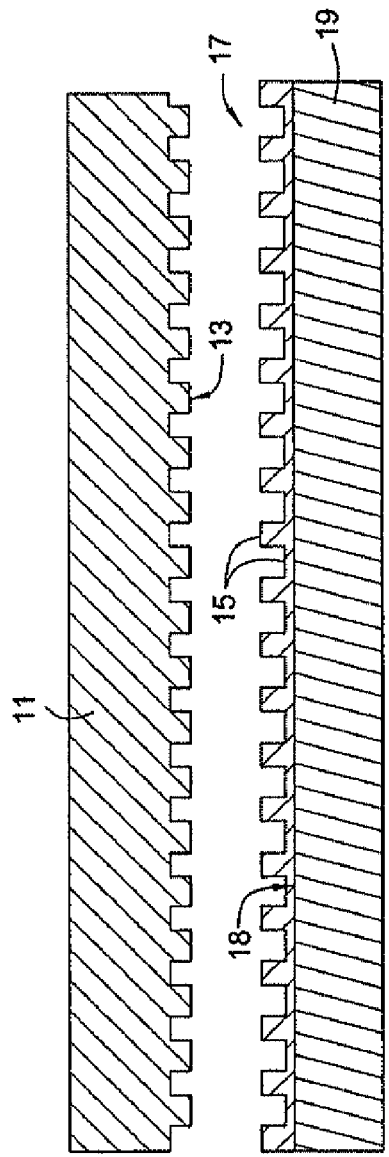
FIG. 1 is a schematic sectional view of a conventional imprinting master and substrate.
Figure 2:
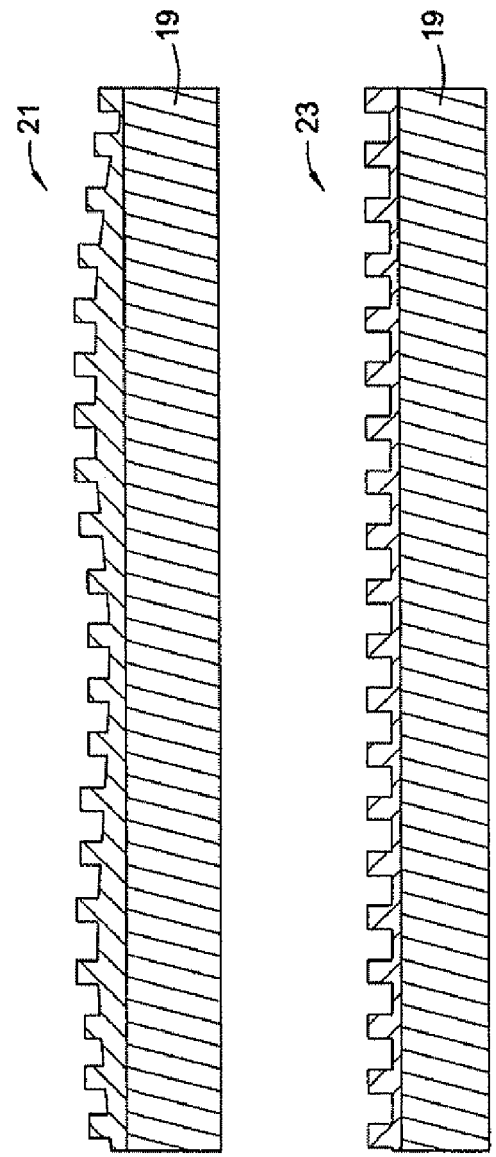
FIG. 2 depicts schematic sectional views comparing imprinted features having poor and good base layer uniformity.
Figure 3:
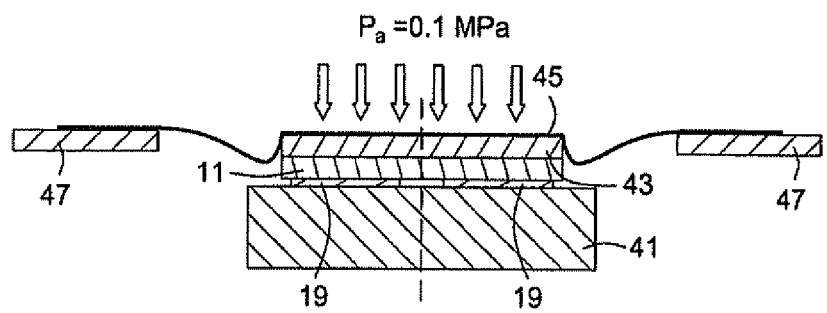
FIG. 3 is a sectional view of a conventional imprinting contact configuration.
Figure 4:
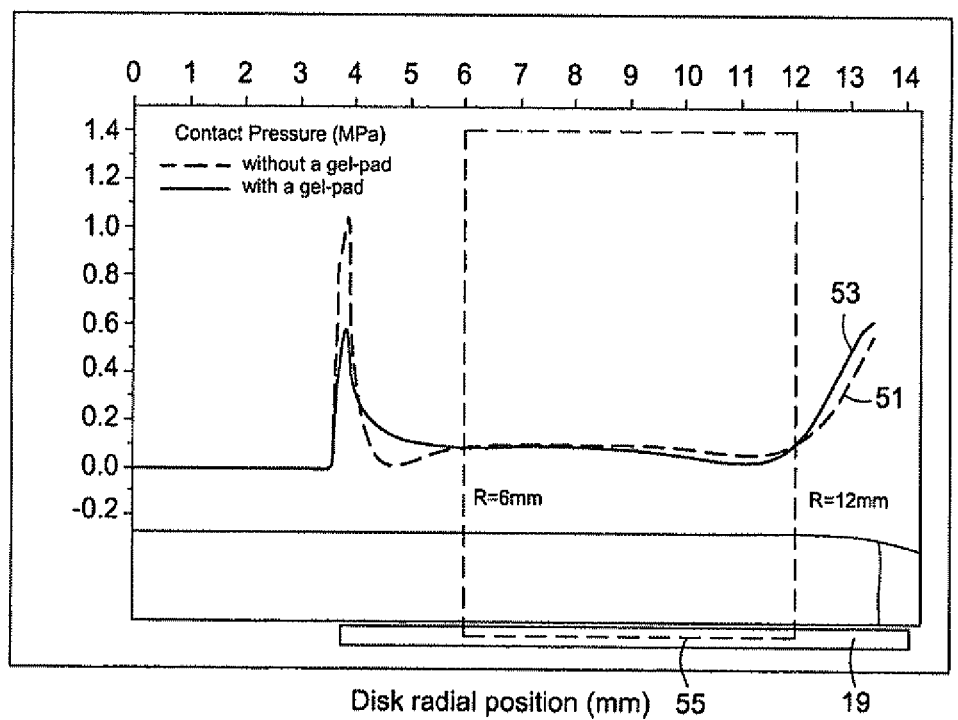
FIG. 4 is a graphical representation of a contact stress profile generated by the conventional configuration of FIG. 3.

The stamper 125 is mounted to the gel pad 117. The stamper 125 has an outer diameter 126, and an axial hole 129 that defines an inner diameter 131 such that the stamper 125 is disk-like or cylindrical in shape and substantially congruent with the disk substrate 101. The stamper 125 also has a contact surface 127 with imprint features (see FIGS. 1 and 2) for imprinting a resist layer on the imprint surface 109 of the disk substrate 101. In one embodiment, the contact surface 127 of the stamper 125 has a radial dimension (see FIG. 6) that is less than a radial dimension of the disk substrate 101 between the inner and outer diameters 103, 107 of the disk substrate 101, such that a radial dimension of the imprint surface 109 of the disk substrate 101 is less than the radial dimension of the disk substrate 101 between the inner and outer diameters 103, 107 of the disk substrate 101. Furthermore, the gel pad 117 may have a radial dimension between its inner and outer diameters 123, 119 that is approximately equal to or slightly less than the radial dimension of the contact surface 127 of the stamper 125.

The present invention also incorporates a central block 133 that is mounted to the membrane 115 and extends through the axial holes 121, 129, 105 of the gel pad 117, the stamper 125, and the disk substrate 101 into contact with the chuck 110. In one embodiment, the central block 133 is cylindrical and extends in an axial direction concentric with the axial holes 121, 129, 105 of the gel pad 117, the stamper 125, and the disk substrate 101, respectively.

As best shown in FIG. 6, the central block 133 has an axial length that is approximately equal to the sum of the axial lengths of the gel pad 117, the stamper 125, and the disk substrate 101. However, because of the flexibility of the membrane 115, some slight differences (either larger or smaller) will not significantly influence the pressure uniformity. In one embodiment, the central block 133 has an axial dimension that is greater than a combined axial dimension of the stamper 125 and the gel pad 117. In addition, the central block 133 has a radial dimension that is less than radial dimensions of the inner diameters 123, 131, 107 of the gel pad 117, the stamper 125, and the disk substrate 101, respectively, such that the central block 133 is free of contact with the gel pad 117, the stamper 125, and the disk substrate 101.

Referring again to FIG. 5, the present invention further comprises one or more directional stages 141 (e.g., x, y, and z directions) and one or more rotational stages 143 for adjusting a position of the chuck 110. A load cell 145 and leveling mechanism 147 are located between the chuck 110 and the directional and rotational stages 141, 143. A quartz window 149 is located above the apparatus for exposing the disk substrate 101 to UV radiation.

A sealed first chamber (or upper chamber) 151 is used for pressurizing the stamper 125 via membrane 115 (see arrows in FIG. 6) by introducing air pressure in chamber 151 and thereby imprint on the disk substrate 101. A separate, sealed second chamber (or lower chamber) 153 contains the disk substrate 101, and may be evacuated or purged with an inert gas such as argon or nitrogen. The imprinting operation may be controlled by manipulating the pressures in the upper and lower chambers 151, 153 independently.

During the imprinting process, the air inside the upper chamber 151 is first pumped out so that the vacuum suction force holds the membrane 115 together with the stamper 125 and gel pad 117 against the quartz window 149. This is the standby position of the stamper assembly. After closing the lower chamber 153 by activating the air cylinder 152, followed by pumping down the chamber 153 to a vacuum state. The upper chamber 151 is then gradually vented to ambient so as to carry on a "vacuum imprinting" or a lower pressure imprinting. These steps form a vacuum environment in the lower chamber 153 and are followed by a low pressure imprinting operation. The pressure range available in the vacuum imprinting scheme can be from 0 to about 10 psi in one embodiment.

Figure 7:
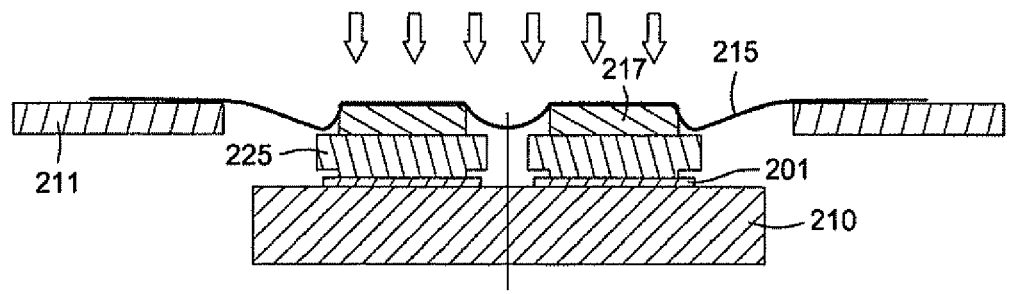
FIG. 7 is a sectional view of an imprinting contact architecture without a center block.

Referring now to FIG. 7, an example of an imprinting system that does not utilize a central block is shown for comparison purposes. This example system is identical to that shown in FIG. 6, including a disk substrate 201, a chuck 210, a stop 211, membrane 215, gel pad 217, and stamper 225. However, membrane 215 has no central block on which to exert pressure.

Figure 8:
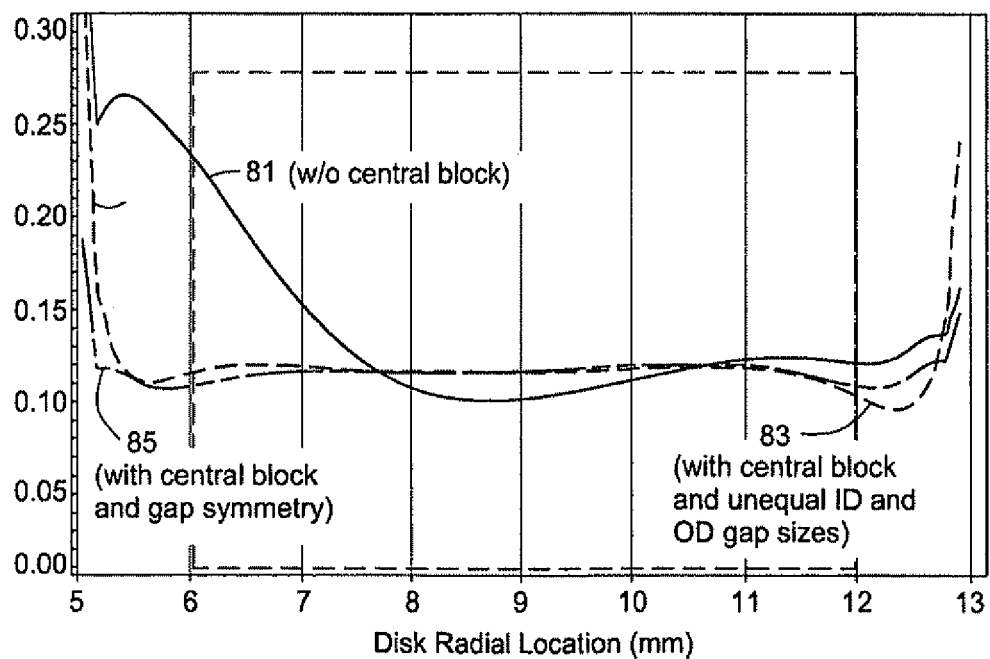
FIG. 8 is a graphical comparison of contact stress profiles generated by the designs of FIGS. 6 and 7.

As shown in FIG. 8, the absence of the central block in the example of FIG. 7 has a dramatic effect on the performance (see plot 81) of the system. In contrast, the embodiment of the present invention shown in FIG. 6 (see plot 83) yields the unexpected results of significantly reduced edge effects by approximately 50%. The contact stress uniformity can be further improved by either changing the gap size, equating the ID and OD gap sizes, or both. Plots 85 and 83 depict the performance of a system with a central block, both with and without equal ID and OD gap sizes, respectively.

Figure 9:
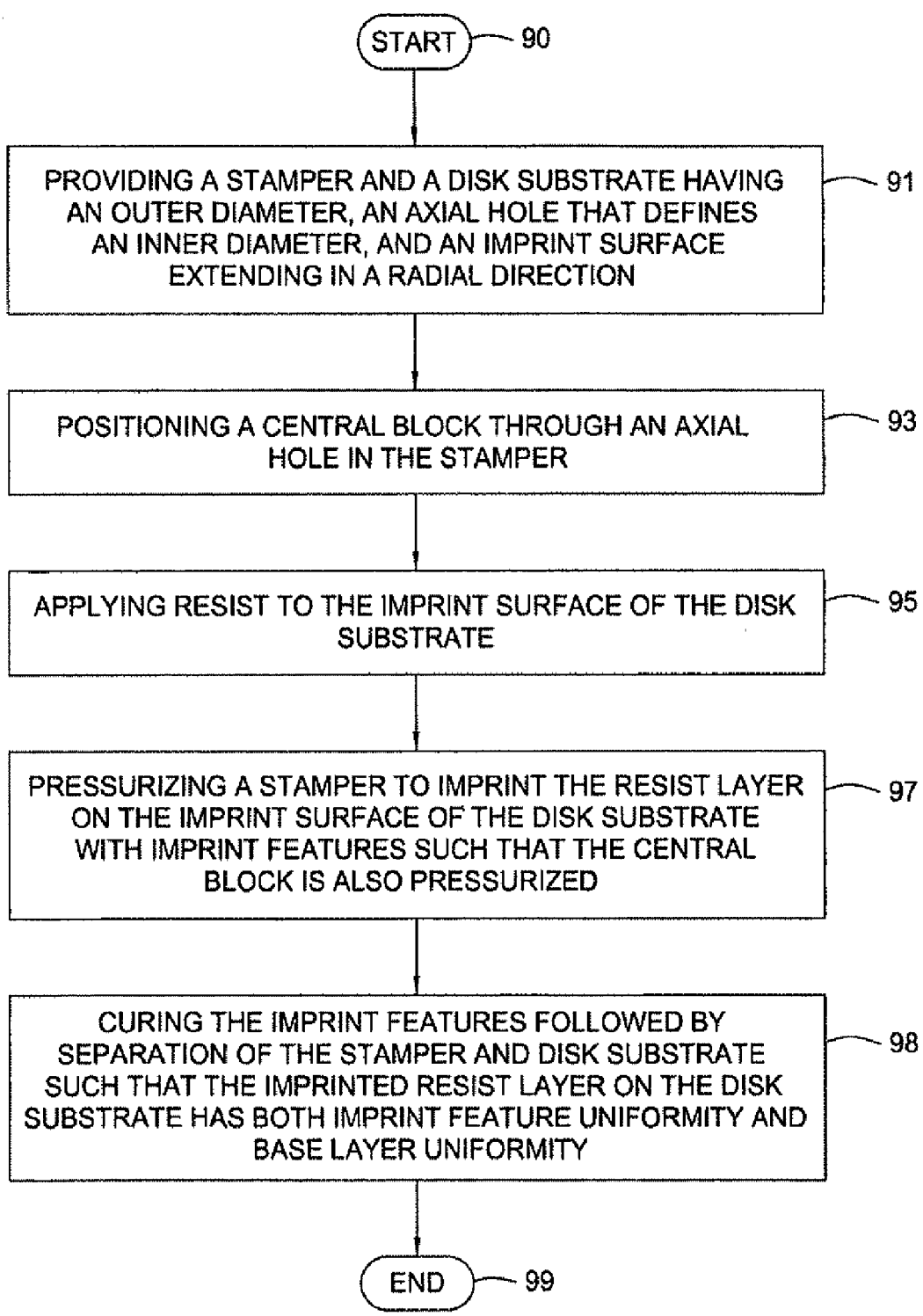
FIG. 9 is a high level flow diagram depicting one embodiment of a method constructed in accordance with the present invention.

In addition, the present invention also includes a method of nanoimprinting for achieving uniform imprint pressure. As shown in FIG. 9, the method begins as illustrated at step 90, and comprises providing a stamper and a disk substrate having an outer diameter, an axial hole that defines an inner diameter, and an imprint surface extending in a radial direction (step 91); positioning a central block through an axial hole in the stamper (step 93); applying resist to the imprint surface of the disk substrate (step 95); pressurizing a stamper to imprint the resist layer on the imprint surface of the disk substrate with imprint features such that the central block is also pressurized (step 97); curing (e.g., via V light) the imprint features followed by separation of the stamper and disk substrate (step 98), before ending as indicated at step 99. The imprinted resist layer left on the disk substrate has both imprint feature uniformity and base layer uniformity.

The method may further comprise providing the central block with an axial dimension that is greater than a combined axial dimension of the stamper and a gel pad, and providing the central block with a radial dimension that is less than radial dimensions of inner diameters of the gel pad, the stamper, and the disk substrate, respectively, such that the central block is free of contact with the gel pad, the stamper, and the disk substrate. In addition, the method may further comprise directionally and rotationally adjusting the disk substrate, adjusting a load and a level of the disk substrate, and exposing the disk substrate to TV radiation.

While the invention has been shown or described in only some of its forms, it should be apparent to those skilled in the art that it is not so limited, but is susceptible to various changes without departing from the scope of the invention.

I claim:

1. A method of nanoimprinting for achieving uniform imprint pressure, comprising:
   (a) providing a stamper and a disk substrate having an outer diameter, an axial hole that defines an inner diameter, and an imprint surface extending in a radial direction;
   (b) positioning a central block through an axial hole in the stamper;
   (c) applying resist to the imprint surface of the disk substrate;
   (d) pressurizing a stamper to imprint the resist layer on the imprint surface of the disk substrate with imprint features such that the central block is also pressurized; and then
   (e) curing the imprint features followed by separation of the stamper and disk substrate such that the imprinted resist layer on the disk substrate has both imprint feature uniformity and base layer uniformity.

2. A method according to claim 1, wherein step (a) further comprises providing the central block with an axial dimension that is greater than a combined axial dimension of the stamper and a gel pad, and providing the central block with a radial dimension that is less than radial dimensions of inner diameters of the gel pad, the stamper, and the disk substrate, respectively, such that the central block is free of contact with the gel pad, the stamper, and the disk substrate.

3. A method according to claim 1, further comprising directionally and rotationally adjusting the disk substrate, adjusting a load and a level of the disk substrate, and exposing the disk substrate to UV radiation.

* * * * *